United States Patent
Uppal et al.

(10) Patent No.: US 11,830,783 B2
(45) Date of Patent: Nov. 28, 2023

(54) EMBEDDED SUBSTRATE HEAT SINK FOR BOTTOM SIDE COOLING

(71) Applicant: Intel Corporation, Santa Clara, CA (US)

(72) Inventors: Aastha Uppal, Chandler, AZ (US); Divya Mani, Chandler, AZ (US); Je-Young Chang, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 900 days.

(21) Appl. No.: 16/600,107

(22) Filed: Oct. 11, 2019

(65) Prior Publication Data
US 2021/0111091 A1    Apr. 15, 2021

(51) Int. Cl.
*H01L 23/367* (2006.01)
*H01L 25/065* (2023.01)
(Continued)

(52) U.S. Cl.
CPC ........ *H01L 23/367* (2013.01); *H01L 21/4875* (2013.01); *H01L 23/10* (2013.01); *H01L 23/3736* (2013.01); *H01L 23/433* (2013.01); *H01L 25/0652* (2013.01); *H01L 25/0655* (2013.01); *H01L 25/165* (2013.01); *H01L 25/50* (2013.01); *H01L 23/3128* (2013.01); *H01L 23/49816* (2013.01)

(58) Field of Classification Search
CPC ... H01L 23/367; H01L 21/4875; H01L 23/10; H01L 23/3736; H01L 23/433; H01L 25/0652; H01L 25/50; H01L 24/32; H01L 24/73; H01L 2224/13101; H01L 25/0655; H01L 25/165; H01L 21/563; H01L 23/3128; H01L 23/49816
See application file for complete search history.

(56) References Cited

U.S. PATENT DOCUMENTS

| | | | | |
|---|---|---|---|---|
| 6,020,224 A | * | 2/2000 | Shimogaichi | ..... H01L 21/02505 257/E29.294 |
| 6,051,888 A | * | 4/2000 | Dahl | ....................... H01L 23/10 257/723 |

(Continued)

*Primary Examiner* — Ahmed N Sefer
(74) *Attorney, Agent, or Firm* — Schwabe, Williamson & Wyatt, P.C.

(57) ABSTRACT

Embodiments include semiconductor packages. A semiconductor package include a high-power electronic component and an embedded heat spreader (EHS) in a package substrate. The EHS is adjacent to the high-power electronic component. The semiconductor package includes a plurality of thermal interconnects below the EHS and the package substrate, and a plurality of dies on the package substrate. The thermal interconnects is coupled to the EHS. The EHS is below the high-power electronic component and embedded within the package substrate. The high-power electronic component has a bottom surface substantially proximate to a top surface of the EHS. The EHS is a copper heat sink, and the high-power electronic component is an air core inductor or a voltage regulator. The thermal interconnects are comprised of thermal ball grid array balls or thermal adhesive materials. The thermal interconnects couple a bottom surface of the package substrate to a top surface of a substrate.

26 Claims, 3 Drawing Sheets

(51) Int. Cl.
  *H01L 23/433* (2006.01)
  *H01L 25/00* (2006.01)
  *H01L 23/10* (2006.01)
  *H01L 21/48* (2006.01)
  *H01L 23/373* (2006.01)
  *H01L 25/16* (2023.01)
  *H01L 23/498* (2006.01)
  *H01L 23/31* (2006.01)

(56) References Cited

U.S. PATENT DOCUMENTS

| | | | | |
|---|---|---|---|---|
| 6,432,749 B1* | 8/2002 | Libres | | H01L 23/3121 |
| | | | | 257/E23.125 |
| 6,472,741 B1* | 10/2002 | Chen | | H01L 23/3128 |
| | | | | 257/659 |
| 8,581,374 B1* | 11/2013 | Chen | | H01L 24/97 |
| | | | | 257/796 |
| 10,966,338 B1* | 3/2021 | Salmon | | H05K 7/20463 |
| 2002/0149108 A1* | 10/2002 | Ahn | | H01L 23/66 |
| | | | | 438/626 |
| 2007/0065984 A1* | 3/2007 | Lau | | H01L 21/561 |
| | | | | 257/E23.092 |
| 2013/0093074 A1* | 4/2013 | Grant | | H01L 25/0655 |
| | | | | 257/713 |
| 2013/0175699 A1* | 7/2013 | Haba | | H01L 24/20 |
| | | | | 257/777 |
| 2014/0070423 A1* | 3/2014 | Woychik | | H01L 21/4857 |
| | | | | 257/774 |
| 2015/0145114 A1* | 5/2015 | Higgins, III | | H01L 23/3675 |
| | | | | 257/692 |
| 2015/0160701 A1* | 6/2015 | Bruno | | H01L 23/5389 |
| | | | | 361/679.31 |
| 2016/0148902 A1* | 5/2016 | Chen | | H01L 25/50 |
| | | | | 438/107 |
| 2017/0162542 A1* | 6/2017 | Chen | | H01L 25/50 |
| 2019/0020343 A1* | 1/2019 | Lee | | H01L 24/24 |
| 2019/0057932 A1* | 2/2019 | Wu | | H01L 23/04 |
| 2019/0206839 A1* | 7/2019 | Balakrishnan | | H01L 25/50 |
| 2019/0238134 A1* | 8/2019 | Lee | | H03K 19/1737 |
| 2020/0286745 A1* | 9/2020 | Elsherbini | | H01L 23/5384 |
| 2021/0035880 A1* | 2/2021 | Goh | | H01L 23/3677 |

\* cited by examiner

EMBEDDED SUBSTRATE HEAT SINK FOR BOTTOM SIDE COOLING

FIELD

Embodiments relate to packaging semiconductor devices. More particularly, the embodiments relate to semiconductor devices with embedded substrate heat sinks for bottom side cooling.

BACKGROUND

For the past several decades, the scaling of features in integrated circuits (ICs) has been a driving force behind an ever-growing semiconductor industry. Scaling to smaller and smaller features enables increased densities of functional units on the limited real estate of semiconductor devices. The drive to scale-down features in ICs such as microelectronic packages, while optimizing the performance of each device, however is not without issue.

In microelectronic packages, high power electronic components (e.g., voltage regulators) are commonly present on the package substrate (e.g., the motherboard) besides the central processing unit (CPU) to ensure the required performance and functionality like conversion of a higher voltage to a lower voltage is supported. Inclusion of such high power components within the package substrate helps enhance the performance of the microelectronic package by improving the transient response between the CPU and the electronic components.

The high power components within the package create thermal resistance paths for the heat to flow, which creates thermal challenges within the package substrate. The current through these components causes high current density due to current crowding. This results in heat generation within the package substrate. Higher substrate temperatures due to presence of high power components in client and desktop microelectronic packages, and high currents in the package substrate for longer periods of time results in higher substrate temperatures that can result in burns, thermal run-aways, and/or component failures in the package substrates.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Figure 1:
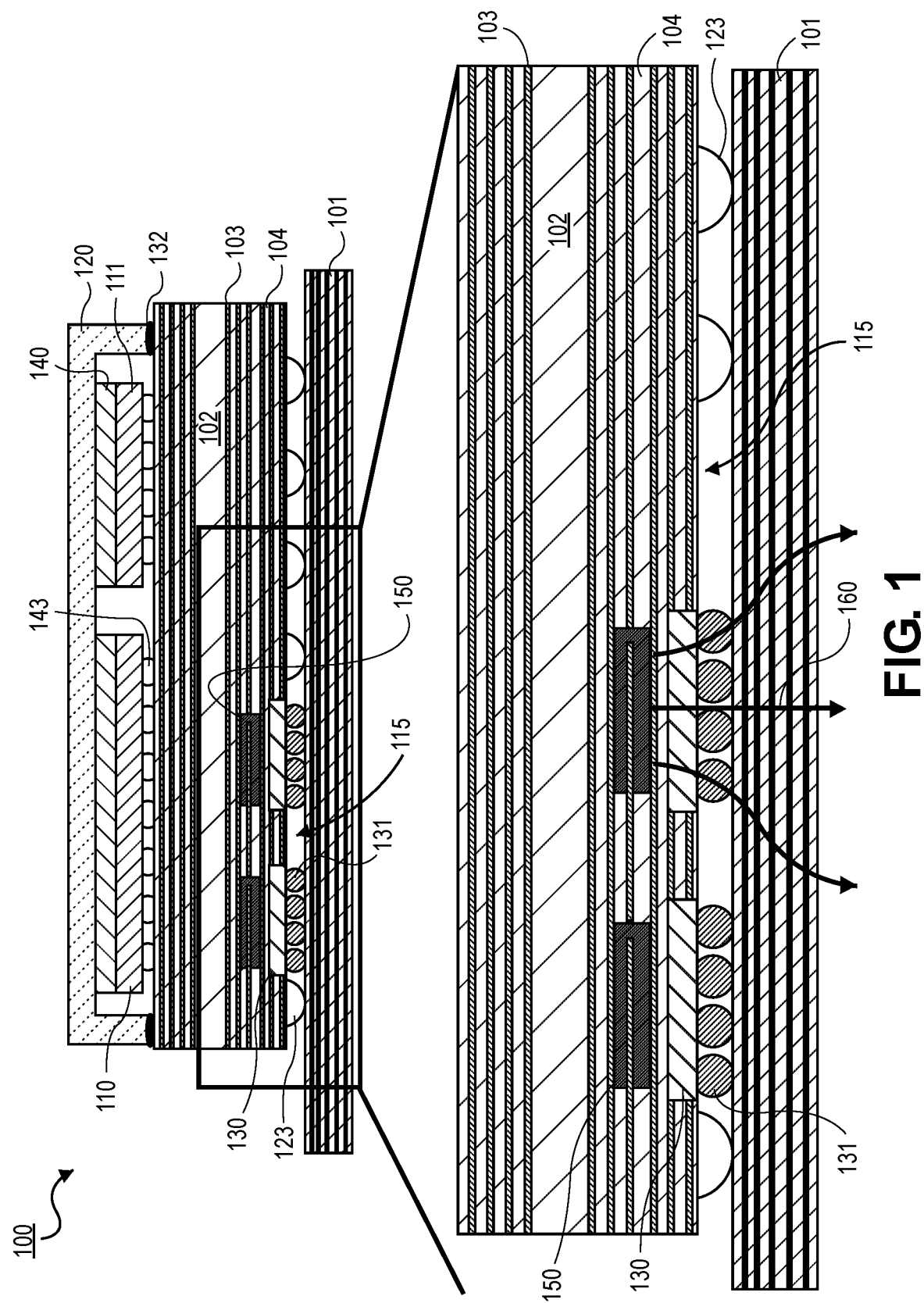
FIG. 1 is an illustration of a cross-sectional view of a semiconductor package with an integrated heat spreader, a thermal interface material, a plurality of dies, and a package substrate with a plurality of high-power electronic components and a plurality of embedded heat spreaders (EHSs), according to one embodiment.

Described herein are semiconductor packages with embedded heat spreaders (EHSs) and methods of forming such semiconductor packages with the EHSs. The semiconductor packages described below and methods of forming such semiconductor packages include an integrated heat spreader (IHS), a thermal interface material (TIM), a plurality of dies, and a package substrate, according to some embodiments. The embodiments of the semiconductor packages described herein may implement a plurality of high-power electronic components (e.g., voltage regulators (VRs), air core inductors (ACIs), etc.) and a plurality of EHSs within the layers of the package substrate, according to some embodiments.

In order to ensure the performance of the semiconductor package is improved with the voltage regulators (or the like) in the package substrate, the EHSs described herein may implement an efficient heat removal away from the package substrate to prevent thermal burns, thermal run-aways, and component failures within the package substrates. As described herein, an "embedded heat spreader" (EHS) may refer to a region, a component, or the like comprised of one or more highly thermal conductive materials (e.g., copper), where such region and/or component may thus help improve the thermal properties of the package substrate. For example, the semiconductor package may embed localized copper (or other highly thermal conductive materials) at approximately the bottommost layer of the package substrate to implement (or form) the EHS, where the EHS may include thermal second level interconnects (SLIs) (e.g., thermal ball grid array (BGA) balls, thermal adhesive materials, or the like) that may be coupled to another substrate (e.g., a printed circuit board (PCB), a motherboard, or the like).

In existing packaging technologies, the high-power components, such as voltage regulators, are typically embedded in the package substrate with the high carrying current coils located in the thermally resistant layers (or regions) of such package substrate. As described above, this results in various thermal issues such as the high current density in these regions that respectively increase the heat generation in the package substrate. These thermal issues include localized high temperature distribution within the layers of the package substrate, and Joule heating and high-power electronic component heating due to the leakage power and trace currents within the package substrate.

Instead, to overcome these thermal issues in the existing packaging technologies, the embodiments described herein implement the EHSs and the thermal SLIs to help extract the heat away (or downward) from the package substrate to the motherboard (or the like). Furthermore, the embodiments described herein provide improvements to existing packaging solutions by enhancing the heat transfer from the package substrate and thus ensuring a lower thermal resistance heat transfer path through the package substrate. Additionally, these embodiments of the EHSs further enhance the heat transfer within the package substrate itself as the EHSs provide the lower resistance heat transfer path for the heat to be directed towards the motherboard and away from the typical heat transfer path upward through the respective package substrate, dies, TIM, and IHS.

Further, the EHSs and thermal SLIs described herein help the semiconductor package by substantially lowering the temperature of the package substrate, which thereby increases the current carrying capability of the high-power electronic components (or ACIs), and also increases the product performance of the semiconductor package. Moreover, with these embodiments of the EHSs, the inclusion of the localized copper (or the like) embedded within the layers of the package substrate help to improve the localized conduction within the package substrate. This also enables cooling the high-power electronic components, which further helps to lower the overall temperature of the package substrate. Also, the heat removed from the high-power electronic components of the package substrate is further directed away from the package substrate with the inclusion of the thermal SLIs (or thermal BGAs). These thermal SLIs described herein extract the heat away from the package substrate towards the motherboard (or the like)—and thus enables cooling the package substrate from the bottommost surface.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, interne devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including semiconductor packages with IHSs, TIMs, dies, and package substrates that have high-power electronic components and EHSs.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Referring now to FIG. 1, a cross-sectional illustration of a semiconductor package 100 is shown, in accordance with an embodiment. In an embodiment, the semiconductor package 100 may include an IHS 120, a TIM 140, a plurality of dies 110-111, and a package substrate 102 with a plurality of high-power electronic components 150 and a plurality of EHSs 130, according to one embodiment. Additionally, in some embodiments, the semiconductor package 100 may include a substrate 101. In these embodiments, the semiconductor package 100 may include the package substrate 102 disposed on the substrate 101, where the package substrate 102 may be coupled to the substrate 101 with a plurality of first solder balls 123. Also, in one embodiment, a cavity 115 may be implemented between the bottom surface of the package substrate 102 and the top surface of the substrate 101.

For one embodiment, the dies 110-111 may be disposed on the package substrate 102, where the dies 110-111 may be a first die 110 and a second die 111 coupled to the package substrate 102 with a plurality of second solder balls 143. In an embodiment, the TIM 140 may be disposed on the first and second dies 110-111. Furthermore, the IHS 120 may be disposed over the TIM 140 and the package substrate 102, where the IHS 120 may be coupled to the package substrate with a sealant 132 (or the like), and where the IHS 120 may surround the first and second dies 110-111, the TIM 140, and the second solder balls 143.

As shown in FIG. 1, the package substrate 102 includes a plurality of conductive layer 103, a plurality of dielectric layers 104, the high-power electronic components 150, the EHSs 130, and a plurality of thermal SLIs 131. In some embodiments, the high-power electronic components 150 and the EHSs 130 are embedded within the conductive and dielectric layers 103-104 of the package substrate 102. Furthermore, in these embodiments, the EHSs 130 may be disposed below and substantially adjacent to (or substantially near) the high-power electronic components 150. For some embodiments, the bottom surfaces of the EHSs 130 may be positioned (or located) adjacent to the bottom surface of the package substrate 102, thereby the thermal SLIs 131 may be disposed within the cavity 115 and couple the bottom surfaces of the EHSs 130 and the package substrate 102 to the top surface of the substrate 101. Accordingly, the semiconductor package 100 may combine the EHSs 130 and the thermal SLIs 131 to implement a heat transfer path 160 (i.e., a lower thermal resistance heat transfer path) that directs the heat from the high-power electronic components 150 downward towards the substrate 101 and away from the package substrate 102, the first and second dies 110-111, the TIM 140, and the IHS 120.

As described herein, the semiconductor package 100 is merely one example of an embodiment of a semiconductor packaged system. That is, the semiconductor package 100 is not limited to the illustrated semiconductor packaged system, and thus may be designed/formed with fewer, alternate, or additional packaging components and/or with different interconnecting structures. For example, while one IHS 120, one TIM 140, two dies 110-111, two high-power electronic components 150, and two EHSs 130 are illustrated in the semiconductor package 100, it is to be appreciated that any number of IHSs 120, TIMs 140, dies 110-111, high-power electronic components 150 and EHSs 130 may be implemented in/on the package substrate 102 of the semiconductor package 100.

For one embodiment, the semiconductor package 100 may include a BGA package, a land grid array (LGA) package, and/or a pin grid array (PGA) package. For one embodiment, as described above, the package substrate 102 may be coupled to the substrate 101 via the first solder balls 123, and the first and second dies 110-111 may be coupled to the package substrate 102 via the second solder balls 143, where the first and second solder balls 123 and 143 may be implemented as solder bumps/joints formed from respective microbumps. A solder ball (or joint) formed by soldering of a microbump according to an embodiment may itself be referred to as a "bump" and/or a "microbump." Additionally, for other embodiments, the first and second dies 110-111 may be coupled to the package substrate 102 using an anisotropic conductive film (ACF) or the like.

The package substrate 102 may include a variety of electronic structures formed thereon or therein. In certain embodiments, the package substrate 102 may be an organic substrate made up of one or more layers of polymer base materials, with conducting regions for transmitting signals. For some embodiments, the package substrate 102 may include, but is not limited to, a package, a substrate, a PCB, and a motherboard. Likewise, in some embodiments, the substrate 101 may include, but is not limited to, a system board, a PCB, and a motherboard. For example, the package substrate 102 may be a PCB (or a substrate) disposed on the substrate 101 that may be a motherboard (or a system board). For one embodiment, the PCB may include an FR-4 glass epoxy base with thin copper foil laminated on both sides. For certain embodiments, a multilayer PCB may be used, with pre-preg and copper foil used to make additional layers. For example, the multilayer PCB, such as the package substrate 102, may comprise alternating layers of organic build-up layers and conductive (e.g., copper) routing layers, such as the alternating conductive and dielectric layers 103-104, as are known in the art. As such, in these embodiments, the package substrate 102 may include the dielectric layers 104, where the dielectric layers 104 may be a photosensitive dielectric layer. Likewise, for these embodiments, the package substrate 102 may include the conductive layers 103, which may further include conductive traces, lines, pads, vias, holes, and/or planes.

Furthermore, in some embodiments, the first and second dies 110-111 may be disposed on and coupled to the top surface of the package substrate 102 with the second solder balls 143. As shown in FIG. 1, the semiconductor package 100 may implement the first die 110 to be disposed adjacent to the second die 111. While, in other embodiments, the semiconductor package 100 may include a stack of dies as such one or more dies may be stacked on/above the first die 110 and/or the second die 111.

In an embodiment, the first and second dies 110-111 may include, but are not limited to, a semiconductor die, a stack of semiconductor dies, an electronic device (e.g., a wireless device), an integrated circuit (IC), a central processing unit (CPU), a graphic processing unit (GPU), a microprocessor, a platform controller hub (PCH), a memory (e.g., a high-bandwidth memory (HBM)), and/or a field-programmable gate array (FPGA). The first and second dies 110-111 may be formed from a material such as silicon and have circuitry thereon that is to be coupled to the package substrate 102. Although some embodiments are not limited in this regard, the package substrate 102 may in turn be coupled to the substrate 101 that may be, for example, a computer motherboard, a system board, and/or the like. In some embodiment, the first die 110 may have a width and/or a thickness that is substantially equal to a width and/or a thickness of the second die 111. In other embodiments, the first die 110 may have a width and/or a thickness that is different than a width and/or a thickness of the second die 111. For one embodiment, the first die 110 may have a top surface that is substantially coplanar to a top surface of the second die 111.

One or more connections between the package substrate 102, the first and second dies 110-111, and the TIM 140—e.g., including some or all of the solder bumps 143—may include one or more interconnect structures, encapsulation layers, underfill layers, and so on. In some embodiments, the interconnect structures may variously comprise an alloy of nickel, palladium, and tin (and, in some embodiments, copper). For one embodiment, the encapsulation layer may include one or more mold materials that are disposed over and/or around the respective components. In an embodiment, the underfill layer may be one or more polymer materials that are injected between the respective components. In an alternative embodiment, the underfill layer may be a molded underfill (MUF) material or the like.

Furthermore, as shown in FIG. 1, the TIM 140 may be directly coupled onto the top surfaces of the first and second dies 110-111 and the bottom surface of the IHS 120. In one embodiment, the TIM 140 may be a solder TIM (STIM) such as an indium STIM or the like. In other embodiments, the TIM 140 may include one or more highly thermal conductivity materials. For example, the TIM 140 may be a metallic TIM, a STIM, a polymer TIM (PTIM), and/or any similar highly thermal conductive material(s). In some embodiments, the thickness of the region of the TIM 140 disposed over the first die 110 may be substantially equal to or different from the thickness of the region of the TIM 140 that is disposed over the second die 111.

In one embodiment, the IHS 120 may be disposed over the TIM 140, the first and second dies 110-111, and the package substrate 102. For one embodiment, the IHS 120 may be manufactured (or shaped) to include a lid and a plurality of legs (or sidewalls, pedestals, etc.). For example, the lid of the IHS 120 may be directly disposed on the top surface of the TIM 140, and the legs of the IHS 120 may be disposed on the package substrate 102, where the legs of the IHS 120 may be coupled to the package substrate 102 with the sealant 132. In some embodiments, the IHS 120 may be a heat sink, a heat spreader, a heat exchanger, a manifold, a cold plate, and/or any similar thermal solution (or device) that may be used to help transfer the heat from the electrical components of the semiconductor package 100 to the ambient environment (or an additional heat spreader). Also, in one embodiment, the sealant 132 may be comprised of one or more adhesive materials such as epoxies, resins, silicon, and/or any known adhesive materials.

Furthermore, the package substrate 100 may include the high-power electronic components 150 and the EHSs 130. In one embodiment, the high-power electronic components 150 may be embedded within the conductive and dielectric layers 103-104 of the package substrate 102, where the high-power electronic components 150 may be positioned near the bottom surface of the package substrate 102. In other embodiments, the high-power electronic components 150 may also be positioned in/on other regions of the package substrate 102, such as on the top surface or near the top surface of the package substrate 102 and so on. For some embodiments, the high-power electronic components 150 may be, but are not limited to, integrated VRs (IVR), VRs, inductors, ACIs, inductor coils, magnetic coils, and/or any other similar electronic components used for high-power capabilities.

In these embodiments, the high-power electronic components 150 may be ACI coils, where the ACI coils may generate heat within the conductive and dielectric layers 103-104 of the package substrate 102. Accordingly, as shown in FIG. 1, the EHSs 130 may be embedded within the conductive and dielectric layers 103-104 of the package substrate 102 and disposed adjacent to the high-power electronic components 150. As such, for these embodiments, the EHSs 130 may be positioned below (or underneath) the high-power electronic components 150 (e.g., positioned below the conductive layer 103 that follows the bottom surface of the high-power electronic components 150) to direct the heat generated by the high-power electronic components 150 downward via the heat transfer path 160 and towards the top surface of the substrate 101. For example, implementing the EHSs 130 substantially near the high-power electronic components 150 helps to conduct the heat away from the package substrate 102 and downward to the substrate 101, and thus helps to substantially reduce the temperature of the package substrate 102.

According to some embodiments, the EHSs 130 may be a heat sink, a heat spreader, a heat exchanger, a manifold, a cold plate, and/or any similar thermal solution (or device), which may be embedded within (or disposed in/on) the package substrate 102 and used to help transfer the heat from the high-power electronic components 150 of the package substrate 102 downward towards the substrate 101, the ambient environment, and/or an additional heat spreader. In some embodiments, the EHSs 130 may be copper (or high-percentage copper) heat sinks disposed in/on/near the bottom surface of the package substrate 102. For some embodiments, the EHSs 130 may have a thickness of approximately 100 um to 150 um. Additionally, in one embodiment, the EHSs 130 may have substantially equal widths and/or thicknesses as each other. While, in another embodiment, the EHSs 130 may have different widths and/or thicknesses as each other. Also note that, while two EHSs 130 are illustrated in FIG. 1, it is to be appreciated that any number of EHSs 130 may be implemented in/on the package substrate 102 (e.g., one EHS 130 may be implemented with a width (or a footprint) that extends to approximately cover the widths (or the footprints) of the two high-power electronic components 150).

Furthermore, as described above, the EHSs 130 may be implemented as a localized region/component (or the like) comprised of one or more highly thermal conductive materials. For some embodiments, the EHSs 130 may be implemented (or manufactured) with a lithographical plating process or the like. While, in other embodiments, the EHSs 130 may be implemented with a pick-and-place process (or the like) that subsequently disposes the EHSs 130 in/on the package substrate 102 and/or in the cavity 115 between the package substrate 102 and substrate 101. In these embodiments, the EHSs 130 may be one or more localized copper regions embedded within the package substrate 102, and implemented (or disposed/formed) adjacent to the bottom layer of the package substrate 102. For example, the bottom surfaces of the EHSs 130 may be substantially coplanar to the bottom surface of the package substrate 102.

Additionally, the thermal SLIs 131 may be coupled to the bottom surfaces of the EHSs 130, where the thermal SLIs 131 may be positioned in the cavity 115 between the bottom surface of the package substrate 102 and the top surface of the substrate 101. In some embodiments, the thermal SLIs 131 may couple the EHS 130 to the substrate 101. In these embodiments, the thermal SLIs 131 may be, but are not limited to, thermal conductive interconnects, thermal BGA balls, and/or thermal adhesive materials (e.g., diamonds, thermal glues/tapes/films, highly conductive thermal materials, and/or the like). For example, as shown in FIG. 1, the thermal SLIs 131 may be a plurality of thermal BGA balls. Also, in some embodiments, the thermal SLIs 131 may have a thickness of approximately 0.6 um to 0.8 um, and/or a thickness that is approximately equal to a thickness of the cavity 115. Accordingly, in the embodiments described herein, implementing the EHSs 130 and the thermal SLIs 131 with the package substrate 102 provides a temperature reduction of approximately 5° C. or greater for the semiconductor package 100, and enhances the air flow in/on the bottom surface of the package substrate 102 and in the cavity 115 between the package substrate 102 and the substrate 101, which thereby increases the overall convective heat transfer coefficient of the semiconductor package 100.

Note that the semiconductor package 100 may include fewer or additional packaging components based on the desired packaging design.

Figure 2:
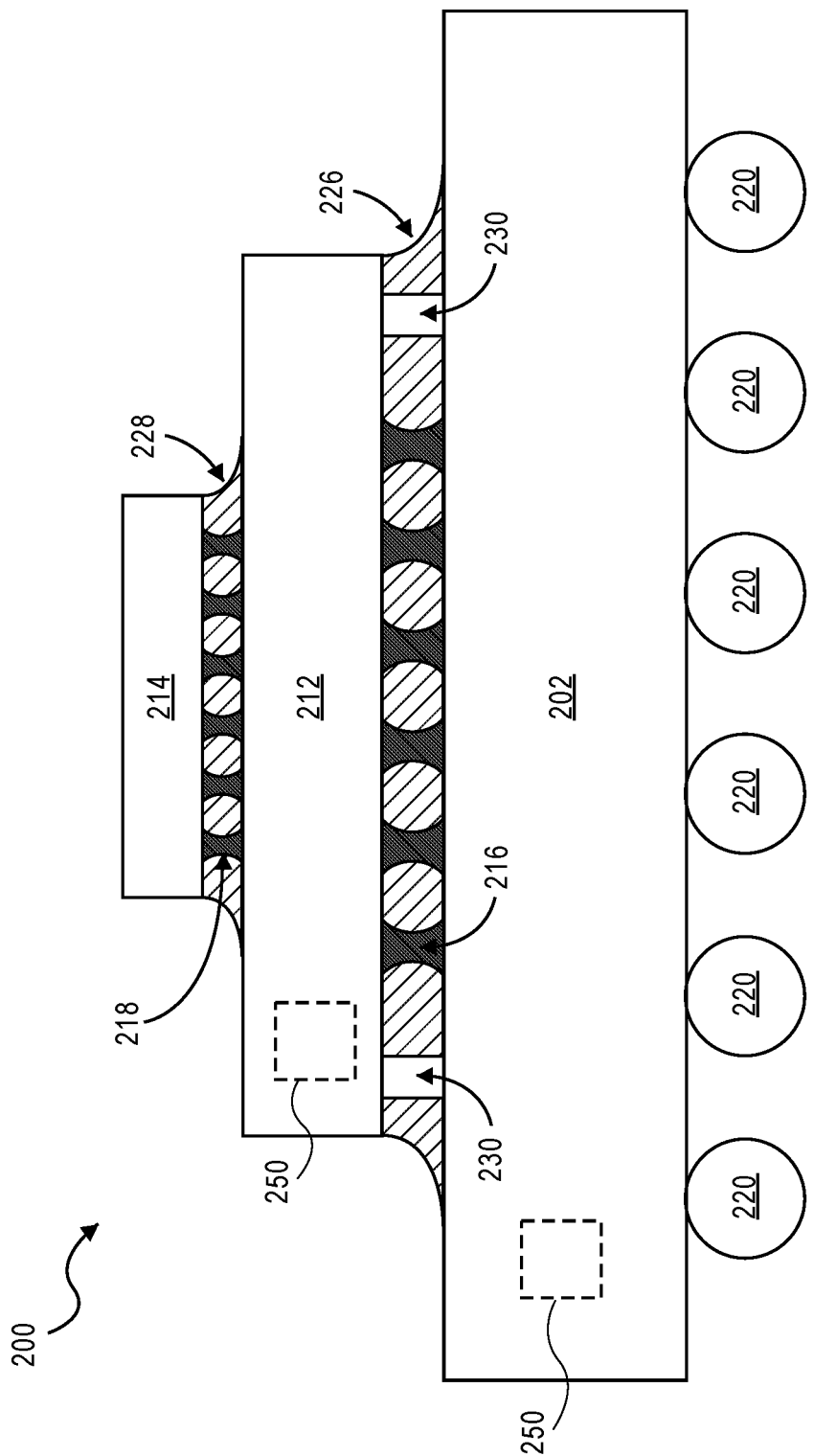
FIG. 2 is an illustration of a cross-sectional view of a semiconductor packaged system including a die, a substrate, a package substrate, and one or more high-power electronic components and a plurality of EHSs, according to one embodiment.

FIG. 2 is an illustration of a cross-sectional view of a semiconductor packaged system 200 including a die 214, a substrate 212, a package substrate 202, and one or more EHSs 250, according to one embodiment. In particular, FIG. 2 illustrates a semiconductor package 200 including a die 214, a substrate 212 (or an interposer), interconnect structures (e.g., the plurality of bumps disposed below the die 214 and the substrate 212), and the package substrate 202, where the substrate 212 and/or the package substrate 202 may include one or more EHSs 250, and where the EHSs 250 may be a heat sink, a heat spreader, a heat exchanger, a manifold, a cold plate, and/or any similar thermal solution (or device) embedded within (or disposed in/on) the respective substrate 212 and/or the package substrate 202, according to some embodiments.

For one embodiment, the semiconductor package 200 may implement the substrate 212 and/or the package substrate 202 to include the EHSs 250. For example, in one embodiment, the EHSs 250 may be localized copper (or high-percentage copper) heat sinks (or the like) embedded in/on/near the bottom surfaces of the package substrate 202 and/or the substrate 212. In another embodiment, the EHSs 250 may also be disposed adjacent to any of the high-power electronic components of the package substrate 202 and/or the substrate 212. Also, in these embodiments, the EHSs 250 may also include and be coupled to a plurality of thermal SLIs as described above. In some embodiments, the EHSs 250 and the thermal SLIs of the substrate 212 and/or the package substrate 202 may be substantially similar to the EHSs 130 and the thermal SLIs 131 described above in FIG. 1. Note that the semiconductor package 200 is not limited to the illustrated semiconductor packaged system, and thus may be designed/formed with fewer, alternate, or additional packaging components and/or with different interconnecting structures.

According to one embodiment, the semiconductor package 200 is merely one example of an embodiment of a semiconductor packaged system. For one embodiment, the semiconductor package 200 may include a BGA package, a LGA package, and/or a PGA package. For one embodiment, a die 214 is coupled to a substrate 212 (e.g., an interposer) via one or more bumps/joints formed from respective microbumps. As described above, a solder joint formed by soldering of a microbump according to an embodiment may itself be referred to as a "bump" and/or a "microbump." Additionally, for other embodiments, the die 214, the substrate 212, and the package substrate 202 may be coupled using ACF. For one embodiment, the substrate 212 may be, but is not limited to, a silicon interposer and/or a die with through silicon vias (TSVs). For an alternate embodiment, the semiconductor package 200 may omit the interposer/substrate 212.

For some embodiments, the semiconductor package 200 may have the die 214 disposed on the interposer 212, where both the stacked die 214 and interposer 212 are disposed on a package substrate 202. According to some embodiments, the package substrate 202 may include, but is not limited to, a package, a substrate, a PCB, and a motherboard. For one embodiment, the package substrate 202 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer can be a photosensitive dielectric layer. For one embodiment, the PCB 202 may also include conductive layers that comprise copper lines/traces, metallic pads, vias, via pads, planes, and/or holes.

For one embodiment, the die 214 may include, but is not limited to, a semiconductor die, an electronic device (e.g., a wireless device), an IC, a CPU, a microprocessor, a PCH, a memory, and/or a FPGA. The die 214 may be formed from a material such as silicon and have circuitry thereon that is to be coupled to the interposer 212. Although some embodiments are not limited in this regard, the package substrate 202 may in turn be coupled to another body, for example, a computer motherboard. One or more connections between the package substrate 202, the interposer 212, and the die 214—e.g., including some or all of bumps 216, 218, and 220—may include one or more interconnect structures and underfill layers 226 and 228. In some embodiments, these interconnect structures (or connections) may variously comprise an alloy of nickel, palladium, and tin (and, in some embodiments, copper).

Connections between the package substrate 202 and another body may be made using any suitable structure, such as the illustrative bumps 220 shown. The package substrate 202 may include a variety of electronic structures formed thereon or therein. The interposer 212 may also include electronic structures formed thereon or therein, which may be used to couple the die 214 to the package substrate 202. For one embodiment, one or more different materials may be used for forming the package substrate 202 and the interposer 212. In certain embodiments, the package substrate 202 is an organic substrate made up of one or more layers of polymer base material, with conducting regions for transmitting signals. In certain embodiments, the interposer 212 is made up of a ceramic base material including metal regions for transmitting signals. Although some embodiments are not limited in this regard, the semiconductor package 200 may include gap control structures 230—e.g., positioned between the package substrate 202 and the interposer 212. Such gap control structures 230 may mitigate a change in the height of the gap between the package substrate 202 and the interposer 212, which otherwise might occur during reflowing while die 214 is attached to interposer 212. Note that the semiconductor package 200 includes an underfill material 228 between the interposer 212 and the die 214, and an underflow material 226 between the package substrate 202 and the interposer 212. For one embodiment, the underfill materials (or layers) 226 and 228 may be one or more polymers that are injected between the layers. For other embodiments, the underfill materials may be MUF.

Note that the semiconductor package 200 may include fewer or additional packaging components based on the desired packaging design.

Figure 3:
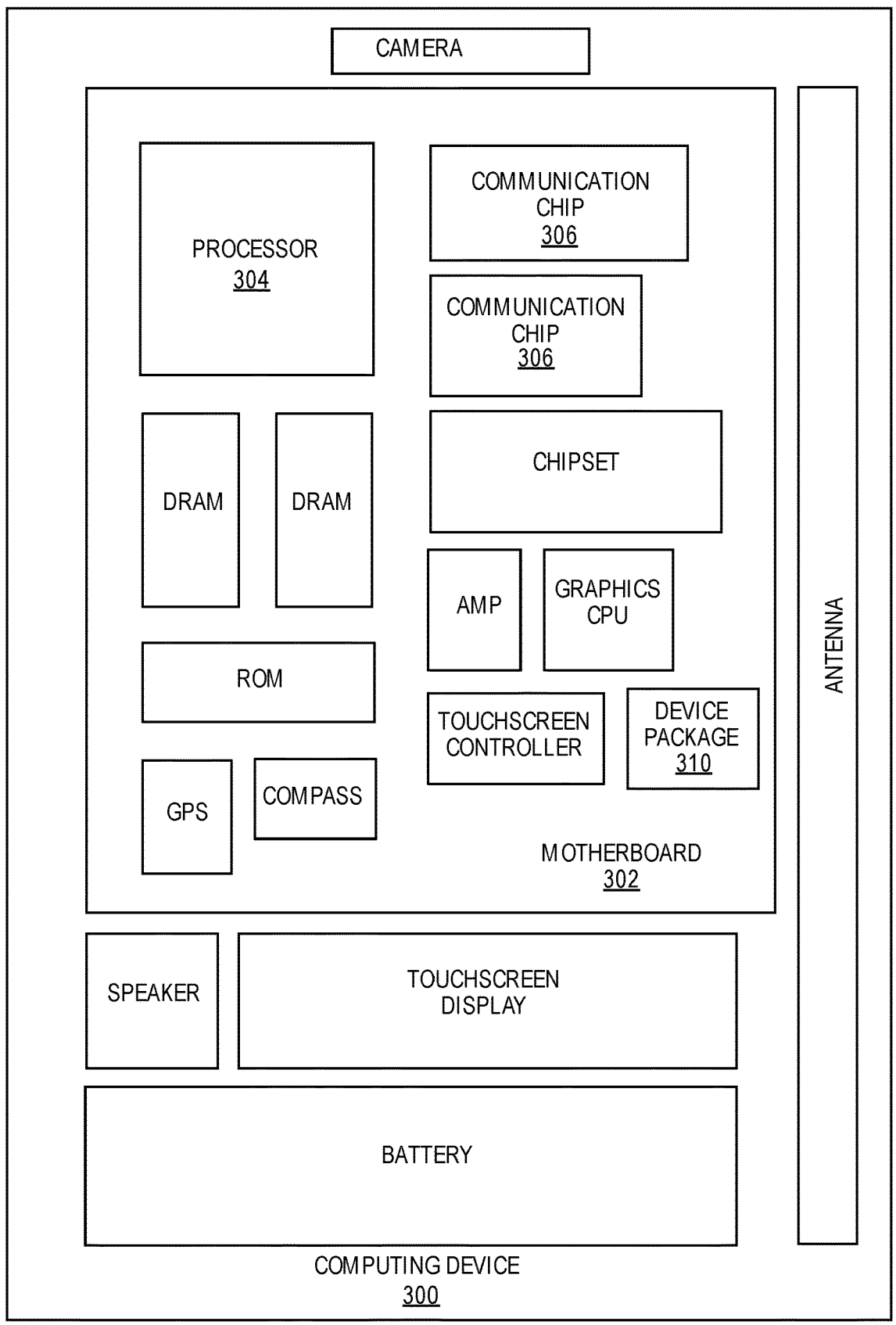
FIG. 3 is an illustration of a schematic block diagram illustrating a computer system that utilizes a package substrate with a plurality of high-power electronic components and a plurality of EHSs, according to one embodiment.

FIG. 3 is an illustration of a schematic block diagram illustrating a computer system 300 that utilizes a device package 310 (or a semiconductor package) with an IHS, a TIM, a plurality of dies, and a package substrate with a plurality of high-power electronic components, a plurality of EHSs, and a plurality of thermal SLIs, according to one embodiment. FIG. 3 illustrates an example of computing device 300. Computing device 300 houses a motherboard 302. Motherboard 302 may include a number of components, including but not limited to processor 304, device package 310 (or semiconductor package), and at least one communication chip 306. Processor 304 is physically and electrically coupled to motherboard 302. For some embodiments, at least one communication chip 306 is also physically and electrically coupled to motherboard 302. For other embodiments, at least one communication chip 306 is part of processor 304.

Depending on its applications, computing device 300 may include other components that may or may not be physically and electrically coupled to motherboard 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 306 enables wireless communications for the transfer of data to and from computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 306 may implement any of a number of wireless standards or protocols, including but not limited to Wi-Fi (IEEE 802.11 family), WiMAX (IEEE 802.112 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

Processor 304 of computing device 300 includes an integrated circuit die packaged within processor 304. Device package 310 may be a semiconductor package as described herein. Device package 310 may include, but is not limited to, a substrate, a package substrate, and/or a PCB. In one embodiment, device package 310 may be substantially similar to the semiconductor packages 100 and 200 of FIGS. 1-2 described herein. Device package 310 may include implementing the EHSs and the thermal SLIs within the package substrate as described herein (e.g., as illustrated and described above with the EHSs and SLIs 130-131 and 250 of FIGS. 1-2)—or any other components from the figures described herein.

Note that device package 310 may be a single component/device, a subset of components, and/or an entire system, as the materials, features, and components may be limited to device package 310 and/or any other component of the computing device 300 that may need the EHSs and thermal SLIs as described herein (e.g., the motherboard 302, the processor 304, and/or any other component of the computing device 300 that may need the embodiments of the EHSs, the thermal SLIs, and/or the semiconductor packages as described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 306 also includes an integrated circuit die packaged within the communication chip 306. For some embodiments, the integrated circuit die of the communication chip 306 may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a semiconductor package, comprising: a high-power electronic component in a package substrate; an EHS in the package substrate, wherein the EHS is adjacent to the high-power electronic component; a plurality of thermal interconnects below the EHS and the package substrate, wherein the plurality of thermal interconnects are coupled to the plurality of EHSs; and a plurality of dies on the package substrate.

In example 2, the subject matter of example 1 can optionally include that the EHS is positioned directly below the high-power electronic component, and the EHS is embedded within the package substrate.

In example 3, the subject matter of examples 1-2 can optionally include that the high-power electronic component has a bottom surface that is substantially proximate to a top surface of the EHS.

In example 4, the subject matter of examples 1-3 can optionally include that the EHS is a copper heat sink, and the EHS has a width that is substantially equal to or greater than a width of the high-power electronic component.

In example 5, the subject matter of examples 1-4 can optionally include that the high-power electronic component is an ACI or a VR.

In example 6, the subject matter of examples 1-5 can optionally include the plurality of thermal interconnects are comprised of thermal BGA balls or thermal adhesive materials.

In example 7, the subject matter of examples 1-6 can optionally include a TIM on the plurality of dies; an IHS over the TIM, the plurality of dies, and the package substrate, wherein the IHS includes a lid and a plurality of legs, and wherein the TIM is directly between the lid of the IHS and the plurality of dies; a sealant on a top surface of the package substrate, wherein the sealant couples the legs of the IHS to the top surface of the package substrate; and a plurality of solder balls couple the package substrate to a substrate.

In example 8, the subject matter of examples 1-7 can optionally include that the plurality of thermal interconnects couple a bottom surface of the package substrate to a top surface of the substrate.

In example 9, the subject matter of examples 1-8 can optionally include that the plurality of thermal interconnects of the EHS thermally couple the bottom surface of the package substrate to the top surface of the substrate.

Example 10 is a method to form a semiconductor package, comprising: disposing a high-power electronic component in a package substrate; disposing an EHS in the package substrate, wherein the EHS is adjacent to the high-power electronic component; disposing a plurality of thermal interconnects below the EHS and the package substrate, wherein the plurality of thermal interconnects are coupled to the EHS; and disposing a plurality of dies on the package substrate.

In example 11, the subject matter of example 10 can optionally include that the EHS is positioned directly below the high-power electronic component, and the EHS is embedded within the package substrate.

In example 12, the subject matter of examples 10-11 can optionally include that the high-power electronic component has a bottom surface that is substantially proximate to a top surface of the EHS.

In example 13, the subject matter of examples 10-12 can optionally include that the EHS is copper heat sink, and the EHS has a width that is substantially equal to or greater than a width of the high-power electronic component.

In example 14, the subject matter of examples 10-13 can optionally include that the high-power electronic component is an ACI or a VR.

In example 15, the subject matter of examples 10-14 can optionally include that the plurality of thermal interconnects are comprised of thermal BGA balls or thermal adhesive materials.

In example 16, the subject matter of examples 11-16 can optionally include disposing a TIM on the plurality of dies; disposing an IHS over the TIM, the plurality of dies, and the package substrate, wherein the IHS includes a lid and a plurality of legs, wherein the TIM is directly between the lid of the IHS and the plurality of dies, and wherein a sealant couples the legs of the IHS to a top surface of the package substrate; and coupling the package substrate to a substrate with a plurality of solder balls.

In example 17, the subject matter of examples 10-16 can optionally include that the plurality of thermal interconnects couple a bottom surface of the package substrate to a top surface of the substrate.

In example 18, the subject matter of examples 10-17 can optionally include that the plurality of thermal interconnects of the EHS thermally couple the bottom surface of the package substrate to the top surface of the substrate.

Example 19 is a semiconductor packaged system, comprising: a package substrate on a substrate; a plurality of dies on the package substrate; a plurality of high-power electronic components in the package substrate; a plurality of EHSs in the package substrate, wherein the plurality of EHSs are adjacent to the plurality of high-power electronic components; a plurality of thermal interconnects below the plurality of EHSs and the package substrate, wherein the plurality of thermal interconnects are coupled to the plurality of EHSs; a TIM on the plurality of dies; and an IHS over the TIM, the plurality of dies, and the package substrate, wherein the IHS includes a lid and a plurality of legs, wherein the TIM is directly between the lid of the IHS and the plurality of dies, and wherein a sealant couples the legs of the IHS to a top surface of the package substrate.

In example 20, the subject matter of example 19 can optionally include that the plurality of EHSs are positioned directly below the plurality of high-power electronic components, and the plurality of EHSs are embedded within the package substrate.

In example 21, the subject matter of examples 19-20 can optionally include the plurality of high-power electronic components have bottom surfaces that are substantially proximate to top surfaces of the plurality of EHSs, and the plurality of high-power electronic components include a first high-power electronic component and a second high-power electronic component.

In example 22, the subject matter of examples 19-21 can optionally include that the plurality of EHSs are copper heat sinks, the plurality of EHSs include a first EHS and a second EHS, the first EHS is positioned directly below the first high-power electronic component, the second EHS is positioned directly below the second high-power electronic component, the first EHS has a width that is substantially equal to or greater than a width of the first high-power electronic component, and the second EHS has a width that is substantially equal to or greater than a width of the second high-power electronic component.

In example 23, the subject matter of examples 19-22 can optionally include that the plurality of high-power electronic components are ACIs or VRs.

In example 24, the subject matter of examples 19-23 can optionally include that the plurality of thermal interconnects are comprised of thermal BGA balls or thermal adhesive materials, and wherein the plurality of thermal interconnects couple a bottom surface of the package substrate to a top surface of the substrate.

In example 25, the subject matter of examples 19-24 can optionally include that the plurality of thermal interconnects of the plurality of EHSs thermally couple the bottom surface of the package substrate to the top surface of the substrate.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A semiconductor package, comprising:
    a high-power electronic component in a package substrate;
    an embedded heat spreader (EHS) in the package substrate, wherein the EHS is adjacent to the high-power electronic component, and wherein the EHS is a discrete component in a cavity in the package substrate;
    a plurality of thermal interconnects below the EHS and the package substrate, wherein the plurality of thermal interconnects are coupled to the EHS;
    a plurality of dies on the package substrates;
    a thermal interface material (TIM) on the plurality of dies;
    an integrated heat spreader (IHS) over the TIM, the plurality of dies, and the package substrate, wherein the IHS includes a lid and a plurality of legs, and wherein the TIM is directly between the lid of the IHS and the plurality of dies;
    a sealant on a top surface of the package substrate, wherein the sealant couples the legs of the IHS to the top surface of the package substrate; and
    a plurality of solder balls couple the package substrate to a substrate.

2. The semiconductor package of claim 1, wherein the EHS is positioned directly below the high-power electronic component, and wherein the EHS is embedded within the package substrate.

3. The semiconductor package of claim 1, wherein the high-power electronic component has a bottom surface that is substantially proximate to a top surface of the EHS.

4. The semiconductor package of claim 3, wherein the EHS is a copper heat sink, and wherein the EHS has a width that is substantially equal to or greater than a width of the high-power electronic component.

5. The semiconductor package of claim 1, wherein the high-power electronic component is an air core inductor (ACI) or a voltage regulator (VR).

6. The semiconductor package of claim 1, wherein the plurality of thermal interconnects are comprised of thermal ball grid array (BGA) balls or thermal adhesive materials.

7. The semiconductor package of claim 1, wherein the plurality of thermal interconnects couple a bottom surface of the package substrate to a top surface of the substrate.

8. The semiconductor package of claim 7, wherein the plurality of thermal interconnects of the EHS thermally couple the bottom surface of the package substrate to the top surface of the substrate.

9. A method to form a semiconductor package, comprising:
    disposing a high-power electronic component in a package substrate;
    disposing an embedded heat spreader (EHS) in the package substrate, wherein the EHS is adjacent to the high-power electronic component, and wherein the EHS is a discrete component in a cavity in the package substrate;
    disposing a plurality of thermal interconnects below the EHS and the package substrate, wherein the plurality of thermal interconnects are coupled to the EHS;
    disposing a plurality of dies on the package substrate;
    disposing a TIM on the plurality of dies;
    disposing an IHS over the TIM, the plurality of dies, and the package substrate, wherein the IHS includes a lid and a plurality of legs, wherein the TIM is directly between the lid of the IHS and the plurality of dies, and wherein a sealant couples the legs of the IHS to a top surface of the package substrate; and
    coupling the package substrate to a substrate with a plurality of solder balls.

10. The method of claim 9, wherein the EHS is positioned directly below the high-power electronic component, and wherein the EHS is embedded within the package substrate.

11. The method of claim 9, wherein the high-power electronic component has a bottom surface that is substantially proximate to a top surface of the EHS.

12. The method of claim 11, wherein the EHS is a copper heat sink, and wherein the EHS has a width that is substantially equal to or greater than a width of the high-power electronic component.

13. The method of claim 9, wherein the high-power electronic component is an ACI or a voltage regulator VR.

14. The method of claim 9, wherein the plurality of thermal interconnects are comprised of thermal BGA balls or thermal adhesive materials.

15. The method of claim 9, wherein the plurality of thermal interconnects couple a bottom surface of the package substrate to a top surface of the substrate.

16. The method of claim 15, wherein the plurality of thermal interconnects of the EHS thermally couple the bottom surface of the package substrate to the top surface of the substrate.

17. A semiconductor packaged system, comprising:
a package substrate on a substrate;
a plurality of dies on the package substrate;
a plurality of high-power electronic components in the package substrate;
a plurality of embedded heat spreaders (EHSs) in the package substrate, wherein the plurality of EHSs are adjacent to the plurality of high-power electronic components;
a plurality of thermal interconnects below the plurality of EHSs and the package substrate, wherein the plurality of thermal interconnects are coupled to the plurality of EHSs;
a TIM on the plurality of dies; and
an IHS over the TIM, the plurality of dies, and the package substrate, wherein the IHS includes a lid and a plurality of legs, wherein the TIM is directly between the lid of the IHS and the plurality of dies, and wherein a sealant couples the legs of the IHS to a top surface of the package substrate.

18. The semiconductor packaged system of claim 17, wherein the plurality of EHSs are positioned directly below the plurality of high-power electronic components, and wherein the plurality of EHSs are embedded within the package substrate.

19. The semiconductor packaged system of claim 17, wherein the plurality of high-power electronic components have bottom surfaces that are substantially proximate to top surfaces of the plurality of EHSs, and wherein the plurality of high-power electronic components include a first high-power electronic component and a second high-power electronic component.

20. The semiconductor packaged system of claim 19, wherein the plurality of EHSs are copper heat sinks, wherein the plurality of EHSs include a first EHS and a second EHS, wherein the first EHS is positioned directly below the first high-power electronic component, wherein the second EHS is positioned directly below the second high-power electronic component, wherein the first EHS has a width that is substantially equal to or greater than a width of the first high-power electronic component, and wherein the second EHS has a width that is substantially equal to or greater than a width of the second high-power electronic component.

21. The semiconductor packaged system of claim 17, wherein the plurality of high-power electronic components are ACIs or VRs.

22. The semiconductor packaged system of claim 17, wherein the plurality of thermal interconnects are comprised of thermal BGA balls or thermal adhesive materials, and wherein the plurality of thermal interconnects couple a bottom surface of the package substrate to a top surface of the substrate.

23. The semiconductor packaged system of claim 17, wherein the plurality of thermal interconnects of the plurality of EHSs thermally couple the bottom surface of the package substrate to the top surface of the substrate.

24. A semiconductor package, comprising:
a high-power electronic component in a package substrate;
an embedded heat spreader (EHS) in the package substrate, wherein the EHS is adjacent to the high-power electronic component;
a plurality of thermal interconnects below the EHS and the package substrate, wherein the plurality of thermal interconnects are coupled to the EHS;
a plurality of dies on the package substrate;
a thermal interface material (TIM) on the plurality of dies;
an integrated heat spreader (IHS) over the TIM, the plurality of dies, and the package substrate, wherein the IHS includes a lid and a plurality of legs, and wherein the TIM is directly between the lid of the IHS and the plurality of dies;
a sealant on a top surface of the package substrate, wherein the sealant couples the legs of the IHS to the top surface of the package substrate; and
a plurality of solder balls couple the package substrate to a substrate.

25. The semiconductor package of claim 24, wherein the plurality of thermal interconnects couple a bottom surface of the package substrate to a top surface of the substrate.

26. The semiconductor package of claim 25, wherein the plurality of thermal interconnects of the EHS thermally couple the bottom surface of the package substrate to the top surface of the substrate.

* * * * *